United States Patent
Toyoda et al.

(10) Patent No.: US 9,728,418 B2
(45) Date of Patent: Aug. 8, 2017

(54) ETCHING METHOD AND ETCHING APPARATUS

(71) Applicant: Tokyo Electron Limited, Tokyo (JP)

(72) Inventors: Keigo Toyoda, Miyagi (JP); Masaru Isago, Miyagi (JP); Hiroshi Tsujimoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1 day.

(21) Appl. No.: 14/785,392

(22) PCT Filed: May 21, 2014

(86) PCT No.: PCT/JP2014/063505
§ 371 (c)(1),
(2) Date: Oct. 19, 2015

(87) PCT Pub. No.: WO2014/189087
PCT Pub. Date: Nov. 27, 2014

(65) Prior Publication Data
US 2016/0079074 A1 Mar. 17, 2016

(30) Foreign Application Priority Data
May 22, 2013 (JP) .................. 2013-107878

(51) Int. Cl.
*H01L 21/3065* (2006.01)
*H01L 21/683* (2006.01)
(Continued)

(52) U.S. Cl.
CPC .... *H01L 21/3065* (2013.01); *H01J 37/32522* (2013.01); *H01J 37/32642* (2013.01);
(Continued)

(58) Field of Classification Search
CPC ............. H01L 21/3065; H01L 21/6831; H01L 21/67069; H01L 21/67248;
(Continued)

(56) References Cited

U.S. PATENT DOCUMENTS 7,952,049 B2 * 5/2011 Tsukamoto ....... H01L 21/67103
118/724
9,396,911 B2 * 7/2016 Tanaka .............. H01J 37/32642
(Continued)

FOREIGN PATENT DOCUMENTS

JP 2006-253541 9/2006
JP 2007-258417 10/2007

*Primary Examiner* — Anita Alanko
(74) *Attorney, Agent, or Firm* — IPUSA, PLLC

(57) ABSTRACT

An etching method for performing a plasma etching on an object to be processed by using a supplied gas is provided. In the etching method, a temperature of a focus ring is adjusted by using a first temperature adjustment mechanism controllable independently of a temperature control of the object to be processed while measuring a time variation until the temperature of the focus ring reaches a target value. A degree of consumption of the focus ring is estimated from the measured time variation based on a preliminarily set correlation between the time variation and the degree of consumption of the focus ring. The target value of the temperature of the focus ring is corrected based on the estimated degree of consumption of the focus ring.

8 Claims, 9 Drawing Sheets

(51) Int. Cl.
*H01L 21/67* (2006.01)
*H01L 21/66* (2006.01)
*H01J 37/32* (2006.01)
*H01L 21/311* (2006.01)

(52) U.S. Cl.
CPC .. *H01L 21/31116* (2013.01); *H01L 21/67069* (2013.01); *H01L 21/67248* (2013.01); *H01L 21/6831* (2013.01); *H01L 22/26* (2013.01)

(58) Field of Classification Search
CPC ............... H01L 21/31116; H01L 22/26; H01J 37/32522; H01J 37/32642
See application file for complete search history.

(56) References Cited

U.S. PATENT DOCUMENTS

| | | | | |
|---|---|---|---|---|
| 2009/0026170 | A1* | 1/2009 | Tanaka | H01J 37/32706 216/60 |
| 2010/0326957 | A1* | 12/2010 | Maeda | H01J 37/20 216/67 |
| 2011/0235056 | A1* | 9/2011 | Matsudo | G01B 11/06 356/630 |
| 2012/0249986 | A1* | 10/2012 | Tanaka | H01J 37/32642 355/55 |
| 2015/0122422 | A1* | 5/2015 | Hayasaka | H01J 37/32467 156/345.53 |

* cited by examiner

ETCHING METHOD AND ETCHING APPARATUS

TECHNICAL FIELD

The present invention relates to an etching method and an etching apparatus.

BACKGROUND ART

A focus ring is provided to surround an outer circumference of a wafer placed on a stage. In a plasma process, the focus ring is exposed to the process and is consumed. Therefore, a technique of estimating a degree of consumption of the focus ring is proposed (for example, see Patent Documents 1 and 2).

PRIOR ART DOCUMENTS

Patent Documents

Patent Document 1: Japanese Laid-Open Patent Application Publication No. 2007-258417
Patent Document 2: Japanese Laid-Open Patent Application Publication No. 2006-253541

SUMMARY OF THE INVENTION

Problem to be Solved by the Invention

When the focus ring is consumed, the thickness of the focus ring varies over time. With this variation, an electric field distribution of a sheath near an edge of a wafer in the vicinity of the focus ring varies. The variation of the electric field of the sheath has an impact on behavior of ions. This causes an etching rate at the edge of the wafer to change over time, thereby negatively affecting uniformity of the etching rate across a surface of the wafer.

In response to the above matters, one embodiment of the present invention aims to improve uniformity of an etching rate across a surface.

Means for Solving the Problem

According to an embodiment of the present invention, there is provided an etching method for performing a plasma etching on an object to be processed by using a supplied gas. In the etching method, a temperature of a focus ring is adjusted by using a first temperature adjustment mechanism controllable independently of a temperature control of the object to be processed while measuring a time variation until the temperature of the focus ring reaches a target value. A degree of consumption of the focus ring is estimated from the measured time variation based on a preliminarily set correlation between the time variation and the degree of consumption of the focus ring. The target value of the temperature of the focus ring is corrected based on the estimated degree of consumption of the focus ring.

According to another embodiment of the present invention, there is provided an etching apparatus configured to perform a plasma etching on an object to be processed by a gas supplied into a chamber. The plasma etching apparatus includes a first temperature adjustment mechanism configured to control a temperature of a focus ring independently of temperature control of the object to be processed and a control unit configured to control the temperature of the focus ring so as to become the target value by using the first temperature adjustment mechanism. The control unit is configured to measure a time variation until the temperature of the focus ring reaches the target value while the first temperature adjustment mechanism adjusts the temperature of the focus ring. The control unit is configured to estimate a degree of consumption of the focus ring from the measured time variation based on a preliminarily set correlation between the time variation and the degree of consumption of the focus ring. The control unit is configured to correct the target value of the temperature of the focus ring based on the estimated degree of the consumption of the focus ring.

Advantageous Effect of the Invention

According to an embodiment of the present invention, uniformity of an etching rate across a surface can be improved.

Figure 1:
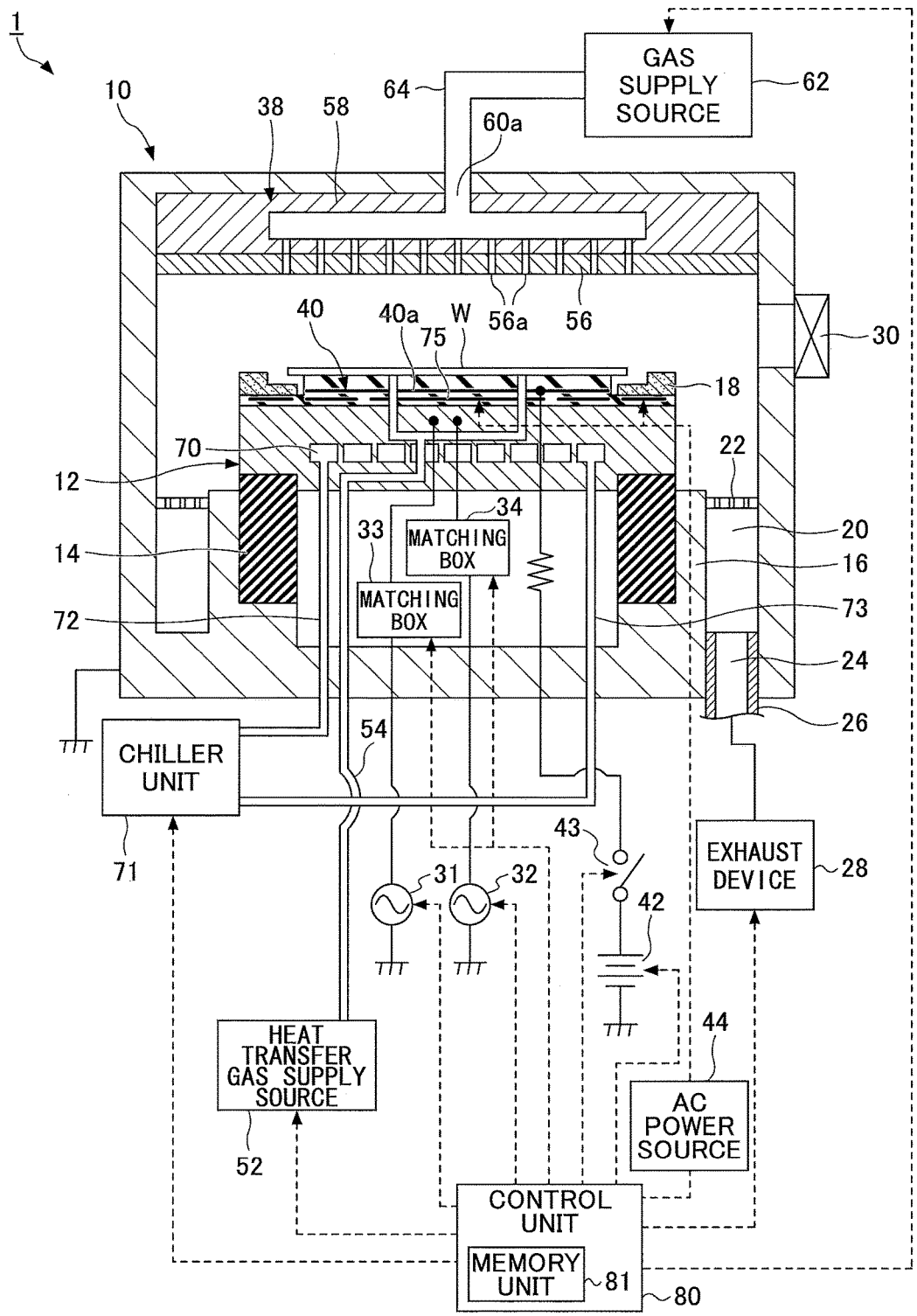
FIG. 1 is a longitudinal cross-sectional view of an etching apparatus according to an embodiment.

DESCRIPTION OF THE REFERENCE NUMERALS 1 etching apparatus
10 chamber
18 focus ring
31 first high frequency power source (for ion attraction)
32 second high frequency power source (for plasma generation)
40 electrostatic chuck
62 gas supply source
75 heater
80 control unit
81 memory unit

EMBODIMENTS FOR IMPLEMENTING THE INVENTION

In the following, embodiments of the present invention are described with reference to the accompanying drawings.

Note that elements having substantially the same functions or features may be given the same reference numerals and overlapping descriptions thereof may be omitted.

[Overall Configuration of Etching Apparatus]

To begin with, a description is given below of an overall configuration of an etching apparatus according to an embodiment of the present invention with reference to FIG. 1. FIG. 1 is a longitudinal cross-sectional view of an etching apparatus according to an embodiment.

In the present embodiment, a description is given below of an example of a capacitively-coupled type plasma etching apparatus using two lower frequencies. However, the etching apparatus 1 of the present embodiment is not limited to this embodiment, and for example, a capacitively-coupled type plasma etching apparatus using two upper and lower frequencies and another type of plasma etching apparatus are also possible.

The etching apparatus 1 includes a cylindrical chamber 10 made of, for example, aluminum whose surface is alumited (anodized). The chamber 10 is grounded. In the chamber 10, an etching process is performed on a semiconductor wafer W (which is hereinafter referred to as a wafer W) by using plasma. The wafer W is an example of an object to be processed. A diameter of the wafer W may be either 300 mm or 450 mm.

A pedestal 12 on which the wafer W is to be placed is provided in the chamber 10. For example, the pedestal 12 is made of aluminum, and is supported by a cylindrical support 16 through an insulating cylindrical holding part 14. A focus ring 18 made of, for example, silicon, is disposed on an upper surface of the pedestal 12 and in a periphery of an electrostatic chuck 40 to improve uniformity of the etching across a surface of the wafer W.

An exhaust passage 20 is formed between a side wall of the chamber 10 and the cylindrical support 16. A circular baffle plate 22 is attached to the exhaust passage 20. An exhaust port 24 is provided in a bottom part of the exhaust passage 20, and is connected to an exhaust device 28 through an exhaust pipe 26. The exhaust device 28 includes a vacuum pump (not shown in the drawings), and reduces a pressure of a process space in the chamber 10 to a predetermined degree of vacuum. A gate valve 30 for transfer that opens and closes a transfer opening of the wafer W is attached to the side wall of the chamber 10.

A first high frequency power source 31 for ion attraction and a second high frequency power source 32 for plasma generation are electrically connected to the pedestal 12 through a matching box 33 and a matching box 34, respectively. The first high frequency power source 31 supplies first high frequency power with a frequency of, for example, 0.8 MHz to the pedestal 12, which is preferable to attract ions of plasma on the wafer W on the pedestal 12. The second high frequency power source 32 supplies second high frequency power with a frequency of, for example, 60 MHz to the pedestal 12, which is preferable to generate plasma in the chamber 10. Thus, the pedestal 12 also functions as a lower electrode. A shower head 38 described later is provided at a ceiling part of the chamber 10 as an upper electrode having a grounded potential. This causes high frequency power from the second high frequency power source 32 to be capacitively supplied to the pedestal 12 and the shower head 38.

An electrostatic chuck 40 is provided on an upper surface of the pedestal 12. The electrostatic chuck 40 is configured to have an electrode 40a made of a conductive film sandwiched between a pair of insulating layers 40b (see FIG. 2). A direct voltage source 42 is electrically connected to the electrode 40a through a switch 43. The electrostatic chuck 40 attracts and holds the wafer W on the electrostatic chuck 40 by Coulomb's force due to a direct voltage from the direct voltage source 42.

A heat transfer gas source 52 supplies a heat transfer gas such as He gas or the like to a space between the upper surface of the electrostatic chuck 40 and a back surface of the wafer W through a gas supply line 54.

The shower head 38 at the ceiling part includes an electrode plate 56 with many gas discharge holes 56a and an electrode support 58 that supports the electrode plate 56 detachably and attachably. The gas supply source 62 supplies a gas from a gas introduction port 60a to the shower head 38 through a gas supply pipe 64. The gas is introduced into the chamber 10 from many of the gas discharge holes 56a.

A refrigerant pipe 70 is provided inside the pedestal 12. A refrigerant of a predetermined temperature is supplied from a chiller unit 71 to the refrigerant pipe 17 through pipes 72 and 73 and circulated therethough. Moreover, a heater 75 is buried in the electrostatic chuck 40. A desired voltage is applied to the heater 75 from an AC power source 44. Such a configuration enables the wafer W to be adjusted to a desired temperature by refrigeration performed by the chiller unit 71 and by application of heat performed by the heater 75. The temperature control is performed based on an instruction from a control unit 80.

The control unit 80 controls each of parts attached to the etching apparatus 1, for example, the exhaust device 28, the AC power source 44, the direct voltage source 42, the switch 43 for the electrostatic chuck 40, the first and second high frequency power sources 31 and 32, the matching boxes 33 and 34, the heat transfer gas supply source 52, the gas supply source 62 and the chiller unit 71. The control unit 80 is also connected to a host computer (not shown in the drawings).

The control unit 80 includes a CPU 41 (Central Processing Unit), a ROM (Read Only Memory), and a RAM (Random Access Memory) that are not shown in the drawings. A memory unit 81 can be implemented by the RAM or the ROM using, for example, a semiconductor memory, a magnetic disk, an optical disk or the like. The memory unit 81 stores a recipe for an etching process and other data (e.g., a temperature control value of the focus ring 18). Moreover, the memory unit 81 stores a correlation between temperature control time and a thickness of the focus ring.

The control unit 80 performs the etching process by using the CPU. The CPU performs the etching process in an etching procedure defined in the recipe stored in the memory unit 81. The CPU performs temperature correction and temperature control of the focus ring by performing a temperature correction program and a temperature control program of the focus ring stored in the memory unit 81. The temperature correction process of the focus ring and the temperature control process of the focus ring are described later.

In the etching apparatus 1 having such a configuration, to perform the etching, to begin with, the gate valve 30 is opened and a wafer W held on a transfer arm (not shown in the drawings) is carried in the chamber 10. The wafer W is held by pusher pins (not shown in the drawings), and is placed on the electrostatic chuck 40 by causing the pusher pins to move down. After the wafer W is carried in the etching apparatus 1, the gate valve 30 is closed, and an etching gas is introduced into the chamber 10 from the gas supply source 62 at a predetermined flow rate and a predetermined flow ratio while a pressure inside the chamber 10 is reduced to a setting value by the exhaust device 28.

Furthermore, each of the first high frequency power source 31 and the second high frequency power source 32 supplies predetermined power of high frequency power to the pedestal 12. In addition, the wafer W is fixed on the electrostatic chuck 40 by applying a voltage from the direct voltage source 42 to the electrode 40a of the electrostatic chuck 40. Moreover, a heat transfer gas is supplied to the space between the upper surface of the electrostatic chuck 40 and the back surface of the wafer W. The etching gas is introduced from the shower head 38 in a shower form, and ionizes and dissociates by the high frequency power from the second high frequency power source 32. This causes plasma to be generated in a plasma generation space between the upper electrode (shower head 38) and the lower electrode (pedestal 12), and radicals and ions in the plasma cause a principal surface of the wafer W to be etched. Furthermore, the high frequency power from the first high frequency power source 31 allows the ions to be attracted toward the wafer W.

After finishing the plasma etching, the wafer W is pushed up by the pusher pins, and is carried out of the gate valve 30 while being held on the transfer arm. The next wafer W is carried in the chamber 10 by the transfer arm. By repeating this process, the wafers W are continuously processed. Hereinabove, the overall configuration of the etching apparatus of the present embodiment has been described.

[Heater]

Figure 2:
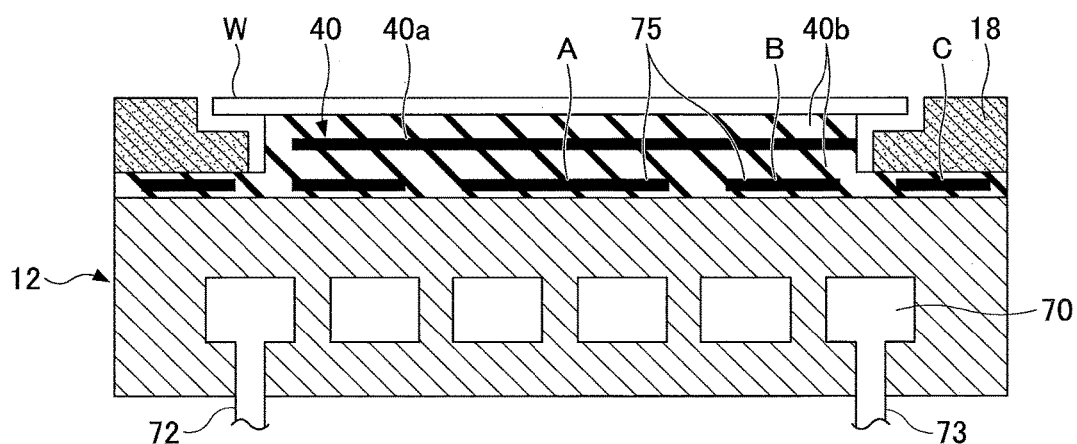
FIG. 2 is a longitudinal cross-sectional view of a pedestal and an electrostatic chuck according to an embodiment.

Next, a description is given below of an inner structure of the heater 75 with reference to FIG. 2. The heater of the present embodiment is divided into a center heater on the center circumferential side, a middle heater B in the center and an edge heater C on the outer circumferential side. The edge heater C is an example of a first temperature adjustment mechanism that can control a temperature of the focus ring 18 independently of the temperature control of the wafer W. The edge heater C may be divided into one or more heaters. The temperature of the focus ring 18 is adjusted to a target temperature value of the focus ting 18. As described later, the target value is corrected depending on a degree of consumption of the focus ring 18.

The center heater A and the middle heater B are an example of a second temperature adjustment mechanism that can control the temperature of the wafer W independently of the temperature control of the focus ring 18. The center heater A and the middle heater B may be unified into one or may be divided into multiple pieces.

The electrostatic chuck 40 of the present embodiment uses an electrostatic chuck mechanism with a built-in heater that quickly adjusts the temperature of the wafer W and the focus ring 18 by incorporating the heater in the electrostatic chuck. The electrostatic chuck mechanism with the built-in heater adopts a member having a high volume resistivity, for example, equal to or more than $1 \times 10^{14}$ Ωcm as the electrostatic chuck 40.

[Variation of Etching Rate]

Figure 3:
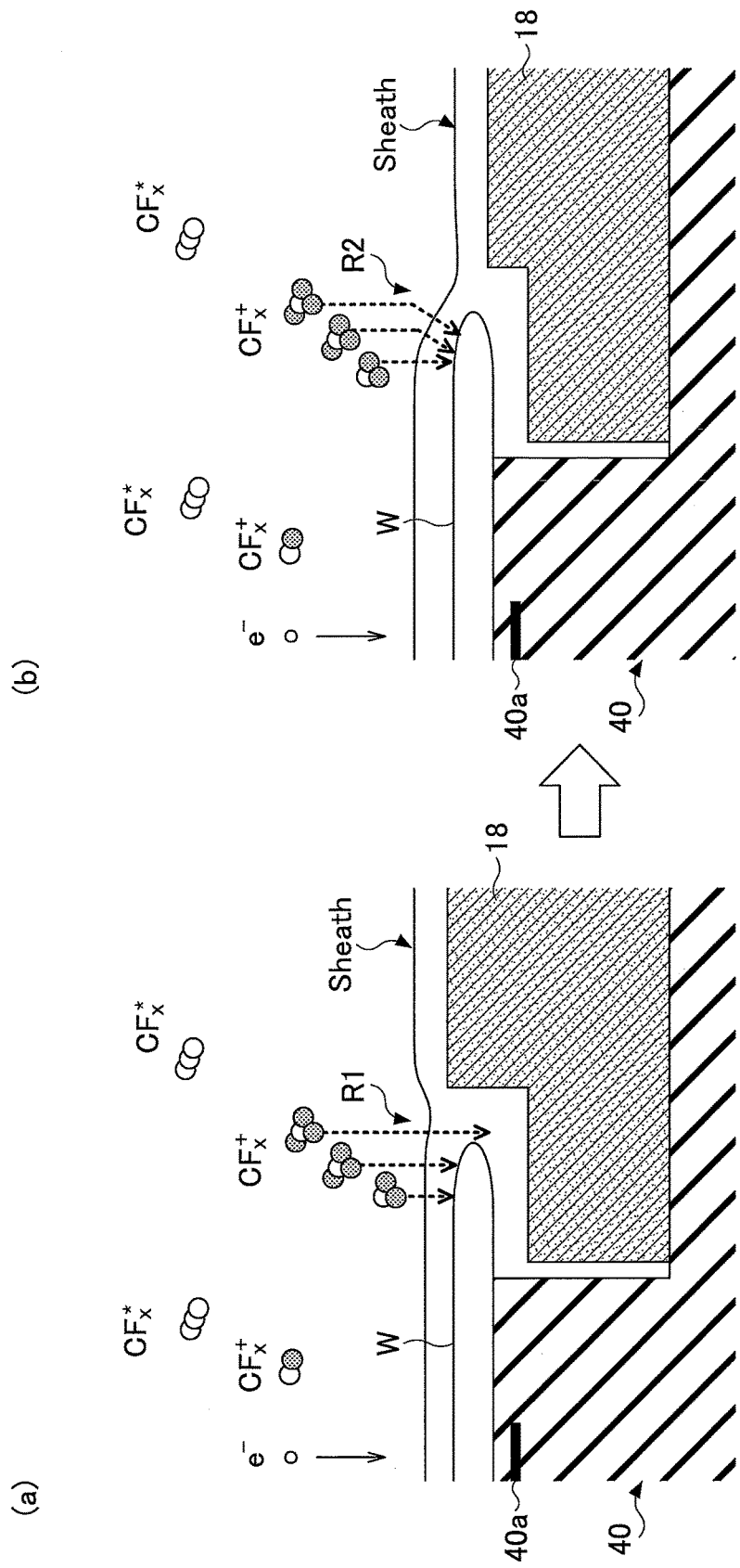
FIG. 3 is a diagram for explaining a temporal change over time of an etching rate according to an embodiment.

Next, a description is given below of a variation of an etching rate in an edge part of the wafer W with reference to FIG. 3. FIG. 3 is a diagram for explaining the variation of the etching rate according to an embodiment. In FIG. 3, ions in plasma is expressed as $CFx^+$, and radicals in the plasma is expressed as $CFx^*$.

In the etching apparatus 1, the focus ring 18 is exposed to the plasma during the plasma process, thereby being consumed. When assuming that the focus ring 18 illustrated in FIG. 3(a) is new, the thickness of the focus ring 18 changes over time as the focus ring 18 is consumed, and becomes thin as illustrated in FIG. 3(b).

With this change, an electric field distribution of a sheath in the vicinity of the edge (the outermost circumference) of the wafer W changes. More specifically, in FIG. 3(a), the electric field is not curved in an area R1 near the edge of the wafer W by the sheath. In contrast, in FIG. 3(b), the electric field is curved in an area R2 near the edge of the wafer W by the sheath because the thickness of the focus ring 18 becomes thin by the consumption of the focus ring 18.

The change of the electric field of the sheath has an impact on a behavior of the ions $CFx^+$. In other words, as illustrated in FIG. 3(b), when the electric field is curved by the sheath, the ions move ahead while being curved toward the edge of the wafer W. As a result, collisions of the ions in the vicinity of the area R2 near the edge of the wafer W increase, and the etching rate of the area R2 near the edge increases. In this manner, the etching rate changes over time depending on a degree of consumption of the focus ring 18, thereby impairing the uniformity of the etching rate across the surface of the wafer W.

[Temperature Adjustment of Focus Ring]

Figure 4:
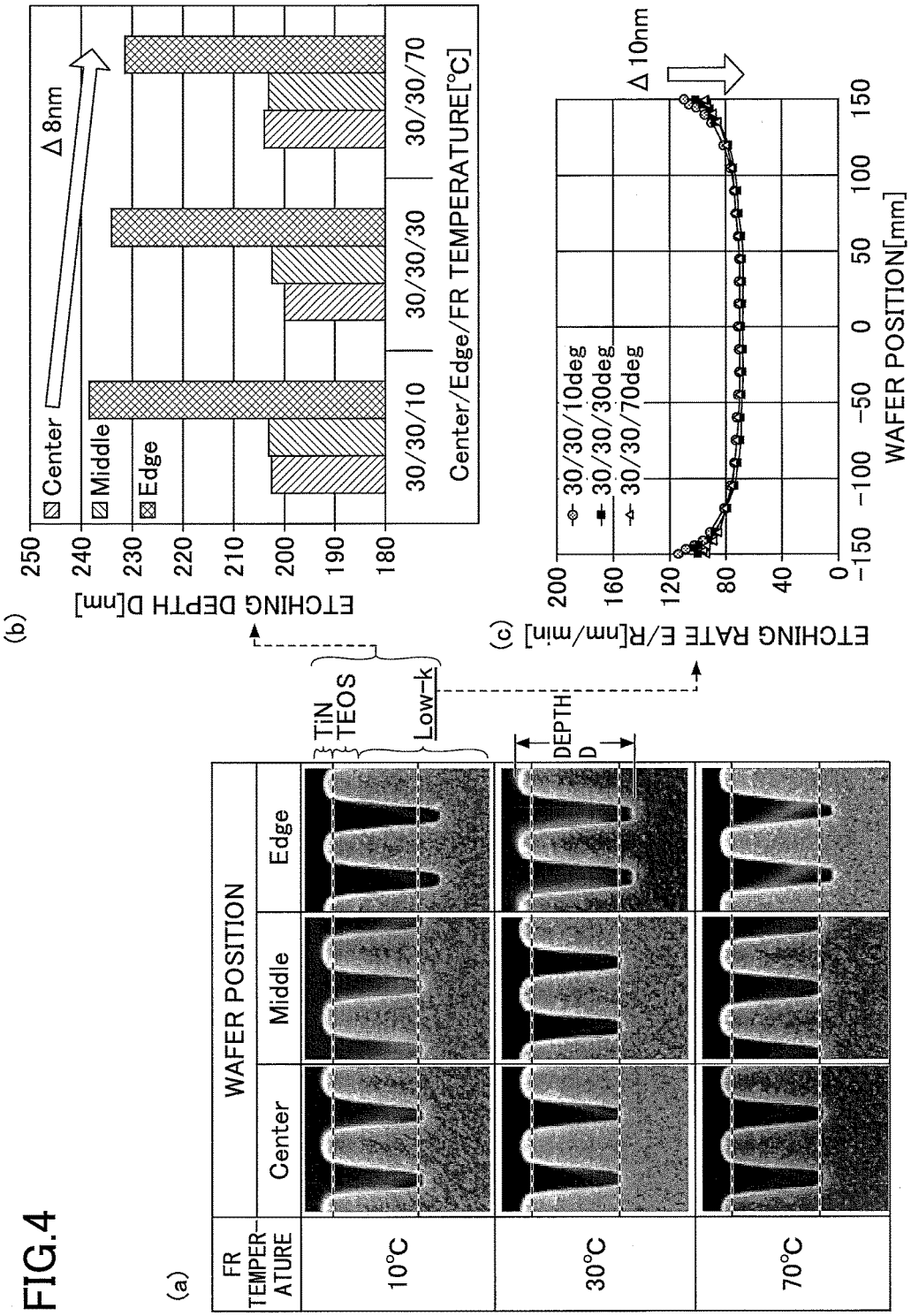
FIG. 4 is a diagram illustrating an effect due to a temperature adjustment of a focus ring according to an embodiment.

In response to this, the inventors performed an experiment on whether or not the etching rate can be controlled at the edge of the wafer W by adjusting the temperature of the focus ring 18. In this experiment, as illustrated in FIG. 4, an etching process was performed on a multiple-layer film formed by stacking a Low-k film, a TEOS (Tetraethyl orthosillicate) film, and a TiN (titanium nitride) film on the wafer W as a film to be etched. The process conditions at this time were as follows.

<Process Conditions>

Pressure 80 mT (10.666 Pa);

First High Frequency Power (LF)/Second High Frequency Power (HF) 200 W/400 W;

Gas Types and Gas Flow Rate $C_4F_8/Ar/N_2/O_2$=30 1200/70/23 sccm;

Temperature Because the edge heater C can control the temperature of the focus ring 18 independently of the temperature control of the wafer W, as shown in FIG. 4(b), the temperature of the focus ring 18 was controlled to be 10 degrees Celsius, 30 degrees Celsius, and 70 degrees Celsius by the edge heater C. The temperatures of the center and the middle of the wafer W are both controlled to be 30 degrees Celsius by the center heater A and the middle heater B.

FIG. 4(a) shows SEM images showing etching shapes of an etched film formed at each of locations (center, middle, and edge) of the wafer W after performing an etching process under the above temperature control conditions.

FIG. 4(b) shows the etching depth D of the etched film shown by the SEM images of FIG. 4(a). The etching depth D shown in a longitudinal axis hardly changed at the center and the middle of the wafer W shown in a transverse axis. On the other hand, the etching depth D decreased with the increasing temperature of the focus ring 18 at the edge of the wafer W. In other words, the result indicated that the etching depth D of the wafer W can be controlled independently by performing the temperature control of the focus ring 18 independently of the temperature control of the wafer W. The result indicates that the etching rate of the edge of the wafer W can be controlled dependently by performing the temperature control of the focus ring 18 independently of the temperature control of the wafer W. That is to say, the increase of the etching rate at the edge of the wafer W due to the consumption of the focus ring can be prevented by controlling the temperature of the focus ring 18.

FIG. 4(c) shows a result of having etched a Low-k film (monolayer film) as the film to be etched while controlling the temperature of the focus ring 18 so as to become 10 degrees Celsius, 30 degrees Celsius and 70 degrees Celsius, and the temperature of the center and the edge of the wafer W so as to become 30 degrees Celsius. In FIG. 4(c), a position of the wafer W is shown in a transverse axis, and an etching rate is shown in a longitudinal axis. This result also indicates that the etching rate decreases with the increasing of the temperature of the focus ring 18. That is to say, the result indicates that the etching rate at the edge of the wafer W can be also independently controlled by performing the temperature control of the focus ring 18 independently of the temperature control of the wafer W even when a Low-k monolayer film is etched as an etching object as well as the etching of the multiple-layer film.

[Temperature Control of Focus Ring]

Figure 5:
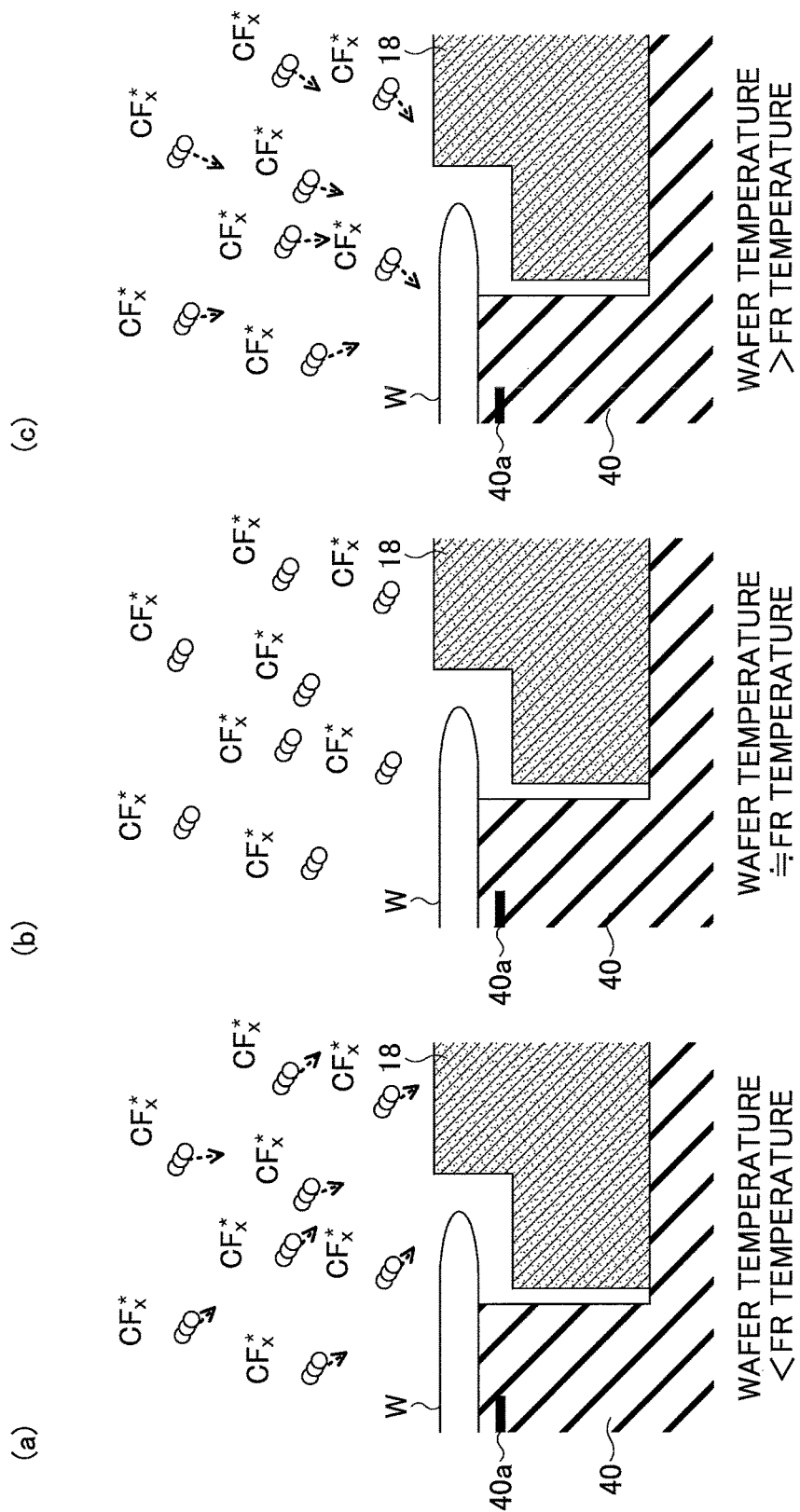
FIG. 5 is a diagram illustrating an example of a temperature of a focus ring and behavior of radicals according to a first embodiment.
Figure 6:
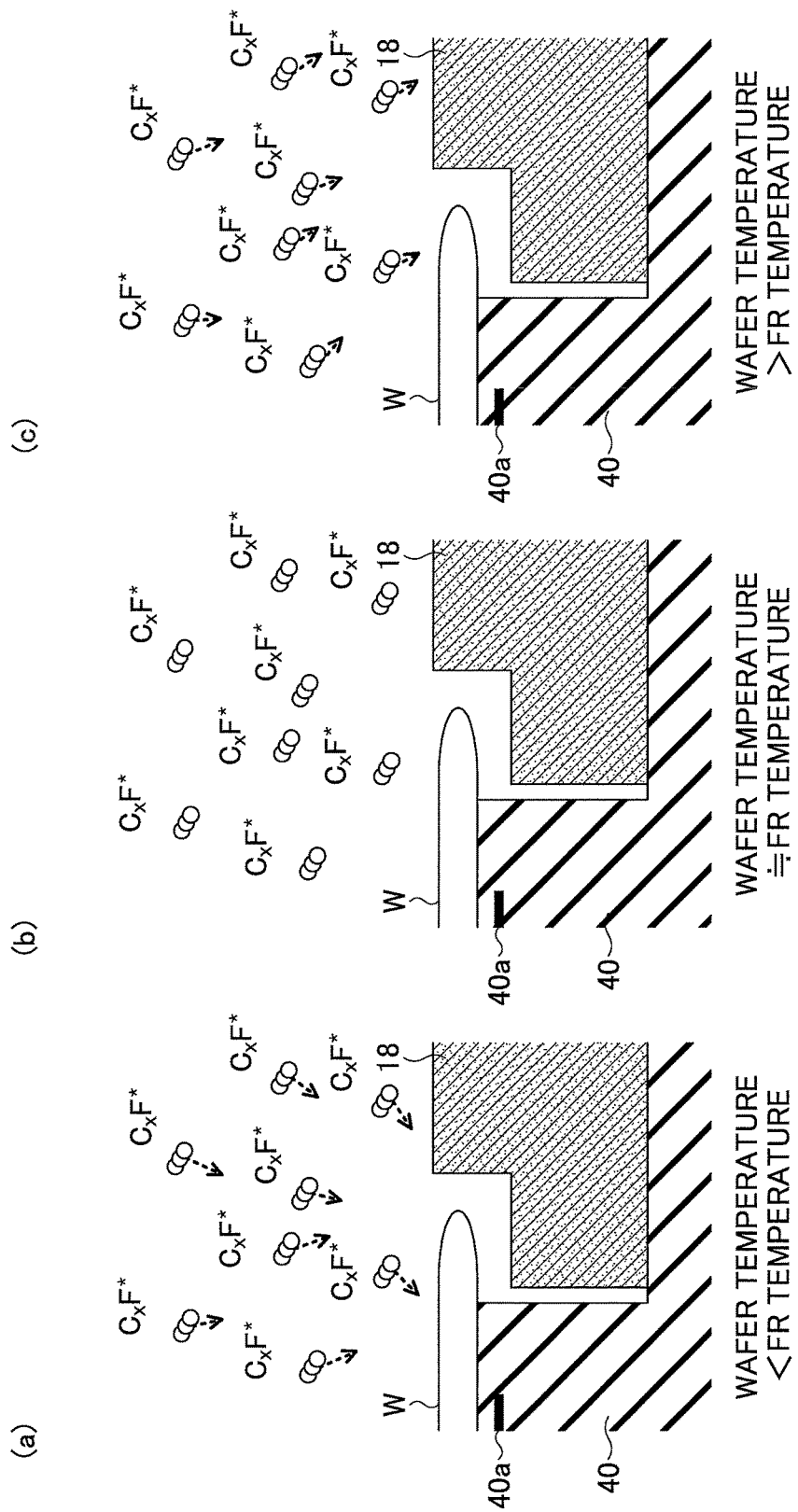
FIG. 6 is a diagram illustrating another example of the temperature of the focus ring and the behavior of radicals according to an embodiment.

Subsequently, a description is given below of an action and an effect on the etching rate at the edge of the wafer W resulted from the temperature control of the focus ring 18 with reference to FIGS. 5 and 6. FIG. 5 illustrates a case of supplying a gas of an etching mode into a chamber, and FIG. 6 illustrates a case of supplying a gas of a deposition mode into the chamber.

Here, the gas of the etching mode means a gas having etching properties that contribute to an etching more than to a production of a deposit (reaction product). On the other hand, the gas of the deposition mode means a gas having properties that contribute to the production of the reaction product more than to the etching. Both modes of the gases are gases to generate radicals when converted to plasma.

More specifically, the gas of the etching mode may contain at least any one of $CH_4$, $C_2F_6$, $C_4F_8$, $Cl_2$, $CCl_4$, $NF_3$, $SF_6$, HBr, $BBr_3$, $C_2F_2$, $O_2$, $H_2$, $CH_4$, COS and $SO_2$. The gas of the deposition mode may contain at least any of $CHF_3$, $CH_2F$, and $SiCl_4$. These gases may be a mixed gas mixed with Ar, He, $N_2$ and the like that function as a carrier gas as necessary.

(Case of Gas of Etching Mode)

When using a gas of an etching mode, plasma contains gas components that contribute to an etching more than gas components that contribute to production of a reaction product. This causes the etching to be prioritized over the production of the reaction product during the etching process when using the gas of the etching mode. In FIGS. 5(a) through 5(c), the gas of the etching mode is expressed as CFx, and radicals of the etching mode is expressed as CFx*. In the plasma, the radicals CFx* are controlled by the temperature, whereas, for example, the ions are controlled by the electric field. Hence, in FIGS. 5(a) through 5(c), only radicals CFx* in the plasma are illustrated to show the relationship between the temperature control and transportation of the radicals CFx*.

When using the gas of the etching mode, the radicals CFx* in the plasma are likely to be transported to a high-temperature side. The reason for this is because the reaction proceeds as the temperature increases, thereby consuming the radicals CFx*. In other words, the radicals CFx* are likely to be transported to the high-temperature side where the radicals CFx* are likely to be consumed.

Accordingly, in the present embodiment, the transportation of the radicals CFx* is controlled by controlling a magnitude relationship between the temperature of the wafer W and the temperature of the focus ring 18. More specifically, as illustrated in FIG. 5(a), when controlling the temperature of the focus ring 18 so as to become higher than the temperature of the wafer W, the radicals CFx* are transported toward the focus ring 18. As a result, a density of the radicals CFx* on a lower temperature side locally reduces, and the edge of the wafer W on the lower temperature side becomes unlikely to be etched. Thus, the etching rate at the edge of the wafer W can be controlled so as to become lower than a usual etching rate by controlling the temperature of the focus ring 18 so as to become higher than the temperature of the wafer W. Here, as illustrated in FIG. 5(a), the usual etching rate means the etching rate at the edge of the wafer W when the temperature of the wafer W is approximately the same as the temperature of the focus ring 18.

In contrast, as illustrated in FIG. 5(c), when controlling the temperature of the wafer W so as to become higher than the temperature of the focus ring 18, the radicals CFx* are likely to be transported toward the edge of the wafer W. As a result, the edge of the wafer W is likely to be etched. In this manner, the etching rate at the edge of the wafer W can be controlled so as to become higher than the usual etching rate by controlling the temperature of the wafer W so as to become higher than the temperature of the focus ring 18.

(Case of Gas of Deposition Mode)

When using a gas of a deposition mode, plasma contains gas components that contribute to production of a reaction product more than gas components that contribute to an etching. This causes the production and deposition of the reaction product to be more prioritized over the etching during the etching process when using the gas of the deposition mode. In FIGS. 6(a) through 6(c), the gas of the deposition mode is expressed as CxF, and the radicals of the deposition mode are expressed as CxF*.

When using the gas of the deposition mode, radicals CxF* in the plasma are likely to be transported to a low-temperature side. The reason for this is because the reaction product is produced and deposited as the temperature decreases. In other words, the radicals CxF* are likely to be transported to the low-temperature side where the radicals CFx* are likely to deposit.

Thus, in the present embodiment, as illustrated in FIG. 6(a), the temperature at the edge of the wafer W is controlled so as to become lower than the temperature of the focus ring 18. This causes the radicals CFx* to be transported toward the edge of the wafer W, and a density of the radicals CFx* on the low-temperature side locally increases. As a result, the reaction product is generated and deposited on a surface on the edge side of the wafer W. In other words, the etching rate at the edge of the wafer W can be controlled so as to become lower than the usual etching rate by controlling the temperature of the wafer W so as to become lower than the temperature of the focus ring 18. Here, for example, as illustrated in FIG. 6(b), the usual etching rate means the etching rate at the edge of the wafer W when the temperature of the wafer W is approximately the same as the temperature of the focus ring 18.

On the other hand, as illustrated in FIG. 6(c), by controlling the temperature of the focus ring 18 so as to become lower than the temperature of the wafer W, the radicals CxF* are transported toward the focus ring 18. As a result, the reaction product is produced and deposits on the low-temperature side focus ring 18, and the radicals CxF* are transported toward the focus ring 18. In this manner, the etching rate at the edge of the wafer W can be controlled so as to become higher than the usual etching rate by controlling the temperature of the focus ring 18 so as to become lower than the temperature of the wafer W.

As discussed above, the inventors have thought that the etching rate at the edge of the wafer W can be controlled by controlling the transportation of the radicals by adjusting the temperature of the focus ring depending on the degree of consumption of the focus ring. Therefore, subsequently, the inventors have created a method of measuring the thickness of the focus ring as one of the measures for estimating the degree of consumption of the focus ring.

[Variation of Temperature Control Time and Thickness of Focus Ring]

Figure 7:
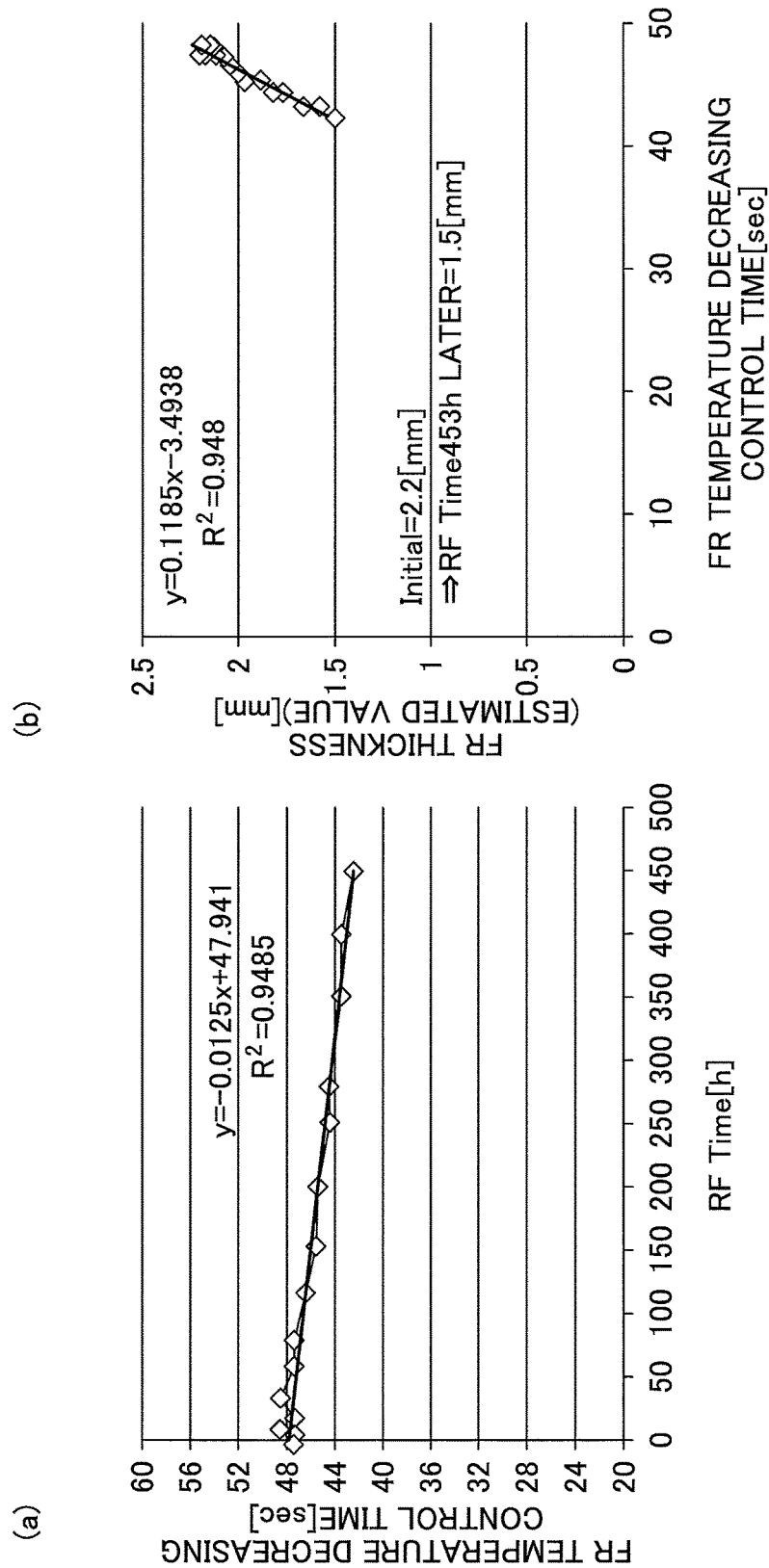
FIG. 7 is a diagram illustrating a correlation between a variation of time for controlling the temperature of the focus ring and a degree of consumption of the focus ring according to an embodiment.

A description is given below of a relationship between a variation of a temperature control time of the focus ring and the thickness of the focus ring. FIG. 7(a) is a diagram showing a correlation between an accumulated value of supply time of high frequency power (RF) in transverse axis and time required for a temperature of the focus ring to be stabilized (here, temperature stabilized time from step A to step B) in a longitudinal axis when controlling the temperature of the focus ring so as to decrease from 70 degrees Celsius to 20 degrees Celsius. The process conditions of the etching process constituted of two steps of step A to step B are as follows.

<Process Condition>
(Before Step A)
Pressure 100 mT (13.33 Pa)
First High Frequency Power (LF)/Second High Frequency Power (HF) 0 W/200 W
Gas Types and Gas Flow Rate Ar=600 sccm
Process Time 4 seconds
(Step A)
Pressure 100 mT (13.33 Pa)
First High Frequency Power (LF)/Second High Frequency Power (HF) 0 W/0 W
Gas Types and Gas Flow Rate Ar=600 sccm
Temperature Center of Wafer/Edge of Wafer/Focus Ring All 70 degrees Celsius
Process Time 15 seconds
(Step B)
Pressure 100 mT (13.33 Pa)
First High Frequency Power (LF)/Second High Frequency Power (HF) 0 W/0 W
Gas Types and Gas Flow Rate Ar=600 sccm
Temperature Center of Wafer/Edge of Wafer/Focus Ring All 20 degrees Celsius
Process Time 15 seconds The result in FIG. 7(a) indicates that the temperature decreasing control time of the focus ring monotonically decreases relative to the accumulated value of the supply time of the high frequency power. As illustrated in FIG. 7(a), a correlation coefficient $R^2$ equals to 0.9485 and approximates to one, which indicates that a line showing the correlation between the accumulated value of the supply time of the high frequency power and the temperature decreasing control time shown in FIG. 7(a) has linearity (decreasing according to a linear function).

In this manner, it is thought that the reason for the decrease of the line showing the correlation according to the linear function is because the time required for stabilizing the temperature of the focus ring by decreasing from 70 degrees Celsius to 20 degrees Celsius was reduced due to the decrease in heat capacity of the focus ring caused by the consumption of the focus ring.

Based on the result discussed above, the inventors measured a relationship between a variation of the temperature control time of the focus ring and the thickness of the focus ring. FIG. 7(b) shows the result. FIG. 7(b) is a graph showing a correlation between a temperature decreasing control time in the transverse axis and the thickness of the focus ring in the longitudinal axis. An initial value of the thickness of the focus ring was 2.2 (mm), and the thickness of the focus ring after the accumulated value of the supply time of the high frequency power became 453 hours, was 1.5 (mm). By using the measurement values, the correlation (approximately linear function) between the variation of the temperature control time of the focus ring and the thickness of the focus ring shown in FIG. 7(b) is obtained. This correlation between the temperature control time of the focus ring and the thickness of the focus ring is stored in the memory unit 81, and is utilized for correction of the focus ring as an estimated value of the degree of consumption of the focus ring.

[Temperature Control of Focus Ring]

Figure 8:
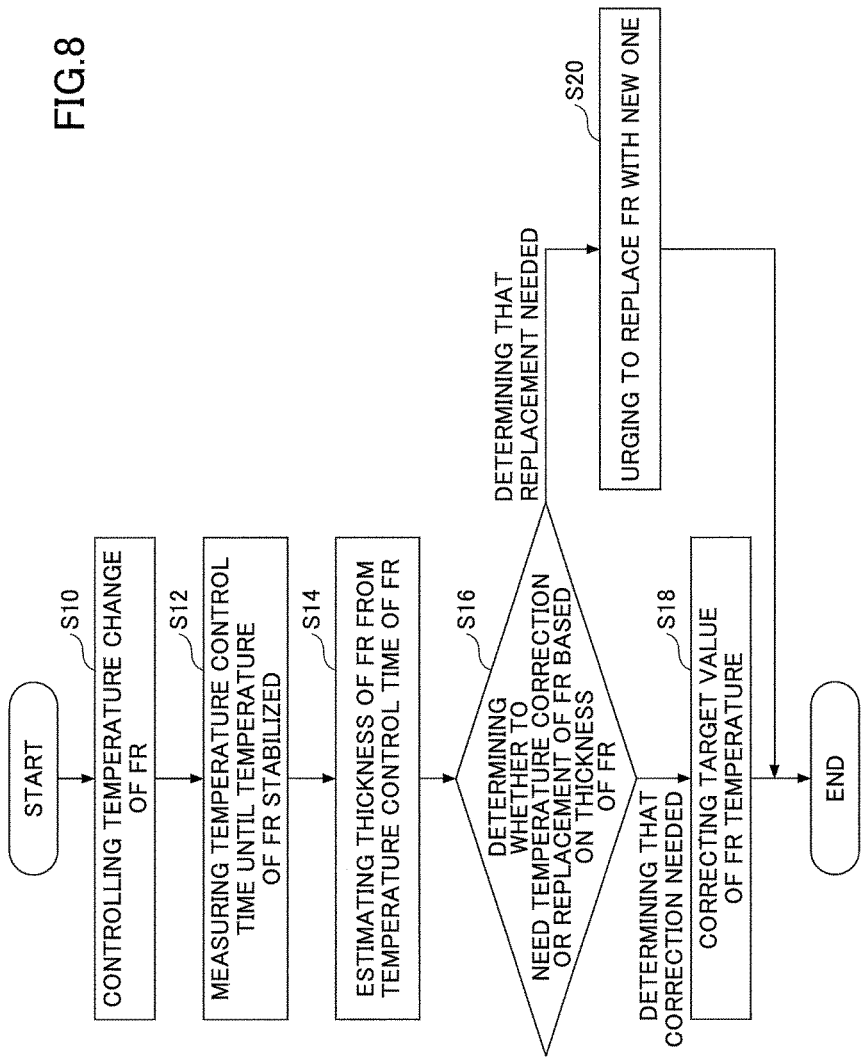
FIG. 8 is a flowchart for performing a temperature correction process of the focus ring according to an embodiment.
Figure 9:
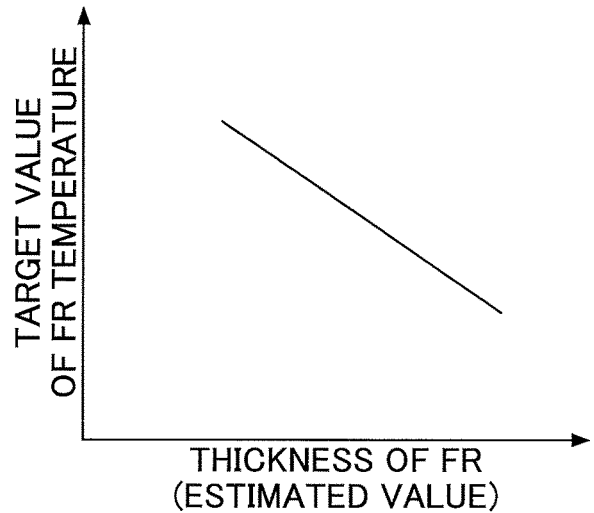
FIG. 9 is an example illustrating a relationship between a thickness of the focus ring and the temperature correction according to an embodiment.
Figure 10:
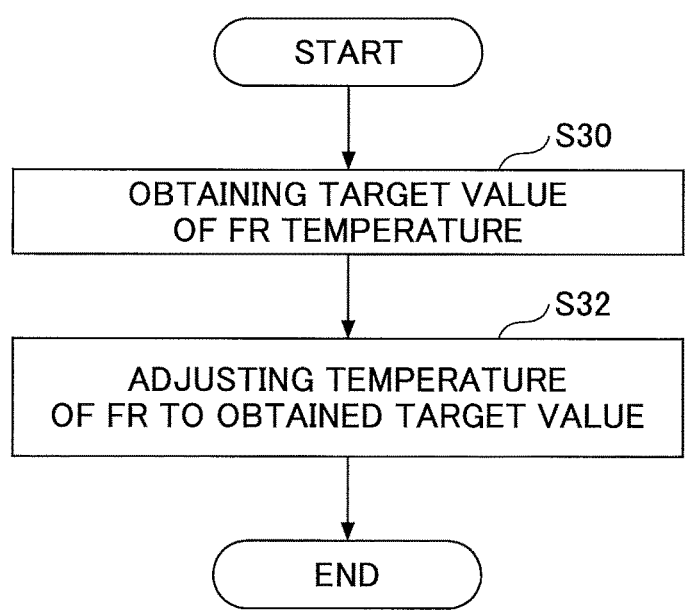
FIG. 10 is a flowchart for performing a temperature control process of the focus ring according to an embodiment.

Next, a description is given below of a method of correcting a target value of a temperature of the focus ring depending on the degree of consumption of the focus ring and controlling the temperature of the focus ring, with reference to FIGS. 8 through 10. FIG. 8 is a flowchart for performing a temperature correction process of the focus ring of the present embodiment. FIG. 9 is an example illustrating a relationship between the thickness of the focus ring and the temperature correction of the present embodiment. FIG. 10 is a flowchart for performing the temperature correction process of the focus ring. Here, the temperature correction process of the focus ring and the temperature control process of the focus ring are performed by causing the control unit 80 to run the temperature correction processing program and the temperature control processing program of the focus ring.

(Temperature Correction Process of Focus Ring)

When the temperature correction process of the focus ring starts, the control unit 80 controls a temperature change of the focus ring (step S10). For example, the control unit 80 changes the temperature of the focus ring from 70 degrees Celsius to 20 degrees Celsius. The control unit 80 may change the temperature to another temperature.

Next, the control unit 80 measures time until the temperature of the focus ring is stabilized, that is to say, temperature control time of the focus ring (step S12).

Subsequently, the control unit 80 estimates the thickness of the focus ring from the temperature control time of the focus ring (step S14). The control unit 80 calculates an estimated value of the thickness of the focus ring depending on the measured temperature control time of the focus ring based on a table of a correlation between the temperature control time of the focus ring and the thickness of the focus ring (whose one example is illustrated in FIG. 7(b)) preliminarily set in the memory unit 81. Here, the table of the correlation between the temperature control time of the focus ring and the thickness of the focus ring is an example of a group of numeral values showing the time variation and the degree of consumption of the focus ring.

The control unit 80 determines whether to perform replacement of the focus ring or correction of a target value of the focus ring (step S16). More specifically, the control unit 80 determines that the focus ring is to be replaced when the thickness of the focus ring is smaller than a preliminarily set threshold and that the target value of the temperature of the focus ring is to be corrected when the thickness of the focus ring is equal to or greater than the threshold.

In step S16, when determining that the target value of the temperature of the focus ring is to be corrected, the control unit 80 corrects the target value so that the temperature of the focus ring relative to the temperature of the wafer W becomes high as the thickness of the focus ring becomes thin (step S18), and ends the present process.

More specifically, when using a gas of an etching mode, the control unit 80 corrects the target value so as to increase the temperature of the focus ring and to cause radicals generated from a supplied gas to be transported toward the focus ring on the high temperature side.

When using a gas of a deposition mode, the control unit 80 causes the temperature on the edge side of the wafer W to relatively decrease by correcting the target value so as to increase the temperature of the focus ring, thereby causing the radicals generated from the supplied gas being transported toward the edge of the wafer W on the low temperature side.

For example, as illustrated in FIG. 9, the memory unit 81 preliminarily stores a table showing a correlation between the thickness of the focus ring and the target value of the temperature of the focus ring. The control unit 80 calculates the target value of the temperature of the focus ring corresponding to the thickness of the focus ring by using the table of the memory unit 81. The corrected target value of the temperature of the focus ring is stored in the memory unit 81.

In step S16, when determining that the focus ring is to be replaced, the control unit 80 urges a user to replace the focus ring (step S20), and ends the present process. For example, the control unit 80 may display a request for replacing the focus ring with a new one on a PC of an operator or may issue a warning sound.

(Temperature Control Process of Focus Ring)

After starting a temperature control process of the focus ring, the control unit 80 obtains a target value of the temperature of the focus ring stored in the memory unit 81 (step S30). Next, the control unit 80 adjusts the temperature of the focus ring to the obtained target value (step S32), and ends the present process.

After the temperature of the focus ring is adjusted to the target value as discussed above, an etching process is performed by using the etching apparatus 1 of the present embodiment. According to this, the transportation of the radicals is controlled by adjusting the temperature of the focus ring depending on a degree of consumption of the focus ring. This prevents the etching rate at the edge of the wafer W from becoming high due to the consumption of the focus ring, thereby enhancing the uniformity of the etching rate across the surface of the wafer W.

Here, process conditions without a variation of the focus ring can continue depending on the contents of the etching process. In this case, by inserting a process for generating a temperature variation of the focus ring between the etching processes, the correction of the target value may be forced to be performed.

As discussed above, although the description of the embodiments of the etching method and the etching apparatus has been given, the etching method and the etching apparatus of the present invention is not limited to the above embodiments, but various modifications and improvements can be made without departing from the scope of the invention. Moreover, the embodiments and modifications can be combined as long as they are not contradictory to each other.

For example, a plasma generation unit of the present invention can be implemented by utilizing a capacitively coupled plasma (CCP: Capacitively Coupled Plasma) generation unit, an inductively coupled plasma (ICP: Inductively Coupled Plasma) generation unit, a helicon wave excited plasma (HWP: Helicon Wave Plasma) generation unit, a microwave excited surface wave plasma generation unit including microwave plasma generated from a radial line slot antenna or SPA (Slot Plane Antenna) plasma, an electron cyclotron resonance (ECR: Electron Cyclotron Resonance Plasma) plasma generation unit, and an electron cyclotron resonance plasma (ECR: Electron Cyclotron Resonance Plasma) generation unit and the like.

An object to be processed in the present invention is not limited to the wafer used in the description of the embodiments, but for example, may be a large substrate for a flat panel display, a substrate for an EL (electroluminescence) device or a solar cell.

The present application is based on and claims the benefit of priority of Japanese Patent Application No. 2013-107878 filed on May 22, 2013, the entire contents of which are herein incorporated by reference.

The invention claimed is:

1. An etching method for performing a plasma etching on an object to be processed by using a supplied gas, comprising steps of:
    adjusting a temperature of a focus ring by using a first temperature adjustment mechanism controllable independently of a temperature control of the object to be processed while measuring a time variation until the temperature of the focus ring reaches a target value;
    estimating a degree of consumption of the focus ring from the measured time variation based on a preliminarily set correlation between the time variation and the degree of consumption of the focus ring; and
    correcting the target value of the temperature of the focus ring based on the estimated degree of consumption of the focus ring.

2. The etching method as claimed in claim 1, wherein the step of correcting the target value of the temperature of the focus ring includes a step of correcting the target value so that the temperature of the focus ring relative to the temperature of the object to be processed becomes higher as the estimated degree of consumption of the focus ring becomes higher.

3. The etching method as claimed in claim 1, wherein the step of correcting the target value includes a step of correcting the target value so that radicals generated from the supplied gas is transported toward the focus ring when the supplied gas has an etching property of more contributing to an etching than to production of a reaction product.

4. The etching method as claimed in claim 3, wherein the supplied gas having the etching property of more contributing to the etching than to the production of the reaction product includes at least any gas of $CF_4$, $C_2F_6$, $C_4F_8$, $Cl_2$, $CCl_4$, $NF_3$, $SF_6$, HBr, $BBr_3$, $O_2$, $H_2$, $CH_4$, COS and $SO_2$.

5. The etching method as claimed in claim 1, wherein the step of correcting the target value includes a step of correcting the target value so that radicals generated from the supplied gas is transported toward an edge of the object to be processed when the supplied gas has an etching property of more contributing to production of a reaction product than to an etching.

6. The etching method as claimed in claim 5, wherein the supplied gas having the etching property of more contributing to the production of the reaction product than to the etching includes at least any gas of $CHF_3$, $CH_2F_2$, $CH_3F$ and $SiCl_4$.

7. The etching method as claimed in claim 1, wherein the step of correcting the target value includes a step of determining whether to perform either replacement of the focus ring or correction of the target value of the focus ring based on the estimated degree of consumption of the focus ring.

8. The etching method as claimed in claim 1, further comprising a step of:

controlling the temperature of the focus ring so as to become the corrected target value.

* * * * *